United States Patent
Johnson et al.

(10) Patent No.: US 9,030,219 B2
(45) Date of Patent: May 12, 2015

(54) VARIABLE PRESSURE FOUR-POINT COATED PROBE PIN DEVICE AND METHOD

(71) Applicant: KLA-Tencor Corporation, San Jose, CA (US)

(72) Inventors: Walter H. Johnson, Rocklin, CA (US); Nanchang Zhu, Shanghai (CN)

(73) Assignee: KLA-Tencor Corporation, Milpitas, CA (US)

(*) Notice: Subject to any disclaimer, the term of this patent is extended or adjusted under 35 U.S.C. 154(b) by 184 days.

(21) Appl. No.: 13/779,392

(22) Filed: Feb. 27, 2013

(65) Prior Publication Data

US 2013/0229196 A1 Sep. 5, 2013

Related U.S. Application Data

(60) Provisional application No. 61/605,612, filed on Mar. 1, 2012.

(51) Int. Cl.
*G01R 1/067* (2006.01)

(52) U.S. Cl.
CPC ............................... *G01R 1/06705* (2013.01)

(58) Field of Classification Search
USPC ................. 324/437, 445–447, 754.01–758.01
See application file for complete search history.

(56) References Cited

U.S. PATENT DOCUMENTS

| | | | |
|---|---|---|---|
| 2,183,974 A * | 12/1939 | Richardson | 73/49.1 |
| 3,735,254 A | 5/1973 | Severin | |
| 4,383,217 A | 5/1983 | Shiell | |
| 5,083,379 A * | 1/1992 | Enderle et al. | 33/556 |
| 6,815,959 B2 * | 11/2004 | Johnson et al. | 324/718 |
| 8,004,296 B2 * | 8/2011 | Di Stefano et al. | 324/750.19 |
| 2003/0060092 A1 | 3/2003 | Johnson et al. | |
| 2008/0216837 A1 * | 9/2008 | Mele | 128/205.24 |
| 2010/0275595 A1 * | 11/2010 | Rastegar et al. | 60/632 |
| 2011/0068206 A1 * | 3/2011 | Kondou | 241/283 |

FOREIGN PATENT DOCUMENTS

RU 2194243 12/2002

* cited by examiner

*Primary Examiner* — Tung X Nguyen
*Assistant Examiner* — Alesa Allgood
(74) *Attorney, Agent, or Firm* — Simpson & Simpson, PLLC

(57) ABSTRACT

A variable pressure probe pin device, including: a housing with a channel having a first longitudinal axis; a probe at least partially disposed in the channel and including a plurality of probe pins configured to measure a property of a conductive layer; and a fluid pressure system configured to supply pressurized fluid o the channel to control a position of the probe within the channel. The housing or the probe is displaceable such that the plurality of probe pins contact the conductive layer.

19 Claims, 10 Drawing Sheets

VARIABLE PRESSURE FOUR-POINT COATED PROBE PIN DEVICE AND METHOD

CROSS-REFERENCE TO RELATED APPLICATIONS

This application claims the benefit under 35 U.S.C. §119(e) of U.S. Provisional Patent Application No. 61/605,612, filed Mar. 1, 2012, which application is incorporated herein by reference.

TECHNICAL FIELD

The present disclosure relates to a variable pressure probe pin device in which a lateral position of the probe is controlled by pressurized fluid. Further, the present disclosure relates to a variable pressure probe pin device in which each pin in a plurality of pins for the probe is coated with an electrically insulating material and in which a longitudinal displacement of the probe is controlled by pressurized fluid.

BACKGROUND

Four-point probe pin devices are used to measure sheet resistance for conductive layers, for example, in semi-conductor applications. Pins for known four-point probe pin devices are isolated from each other by drilled holes with separate bearings or by micro positioning controls and an air gap, commonly called micromanipulators. U.S. Pat. No. 4,383,217 teaches four pins disposed in drilled holes in a retaining strip. The separate bearing method limits the minimum gap between pins due to the pin diameter, bearing thickness, and hole separation distance. The micromanipulator arm approach is expensive and does not allow for the manufacturing of a complete probe head assembly with multiple contacts. Commonly owned U.S. Pat. No. 6,815,959 teaches four pins in a probe pin device with spacers made of separate sheets of insulating material disposed between the pins. The spacers make assembly difficult and the thickness of the spacers acts to limit the extent to which the gap between pins can be minimized. Known configurations also prevent or make difficult replacement of individual pins in a probe pin device.

It is known to use springs to urge a four-point probe pin device toward and into a conductive layer for purposes of measuring sheet resistance. However, unless the spring is exactly centered on the appropriate portion or portions of the probe pin device, force from the spring can skew the probe pin device out of a desired orientation with respect to the conductive layer. Also, the useful lifetime of springs is limited, typically to between 100 to 1,000 touchdowns. Further, to vary spring pressure either additional components such as adjustment screws are needed, or the spring must be removed and replaced with another spring having the desired characteristics.

SUMMARY

According to aspects illustrated herein, there is provided a variable pressure probe pin device, including: a housing with a channel having a first longitudinal axis; a probe at least partially disposed in the channel and including a plurality of probe pins configured to measure a property of a conductive layer; and a fluid pressure system configured to supply pressurized fluid to the channel to control a position of the probe within the channel. The housing or the probe is displaceable such that the plurality of probe pins contact the conductive layer.

According to aspects illustrated herein, there is provided a variable pressure probe pin device, including: a housing including a pressure chamber and a channel with a first longitudinal axis; a probe at least partially disposed in the channel and including a plurality of probe pins configured to measure a property of a conductive layer; and an fluid pressure system configured to control fluid pressure in the pressure chamber to displace the probe in a direction parallel to the first longitudinal axis.

According to aspects illustrated herein, there is provided a method of measuring a property of a conductive layer using a variable pressure probe pin device including a housing with a channel having a first longitudinal axis, an fluid pressure system, and a probe at least partially disposed in the channel and with a plurality of probe pins, including: supplying, using the fluid pressure system, pressurized fluid to the channel; controlling, with the pressurized fluid, a position of the probe within the channel; displacing the housing or the probe so that the plurality of probe pins contact the conductive layer; and, measuring a property of the conductive layer.

BRIEF DESCRIPTION OF THE DRAWINGS

Various embodiments are disclosed, by way of example only, with reference to the accompanying schematic drawings in which corresponding reference symbols indicate corresponding parts, in which.

DETAILED DESCRIPTION

At the outset, it should be appreciated that like drawing numbers on different drawing views identify identical, or functionally similar, structural elements of the disclosure. It is to be understood that the disclosure as claimed is not limited to the disclosed aspects.

Furthermore, it is understood that this disclosure is not limited to the particular methodology, materials and modifications described and as such may, of course, vary. It is also understood that the terminology used herein is for the purpose of describing particular aspects only, and is not intended to limit the scope of the present disclosure.

Unless defined otherwise, all technical and scientific terms used herein have the same meaning as commonly understood to one of ordinary skill in the art to which this disclosure belongs. It should be understood that any methods, devices or materials similar or equivalent to those described herein can be used in the practice or testing of the disclosure.

Figure 1:
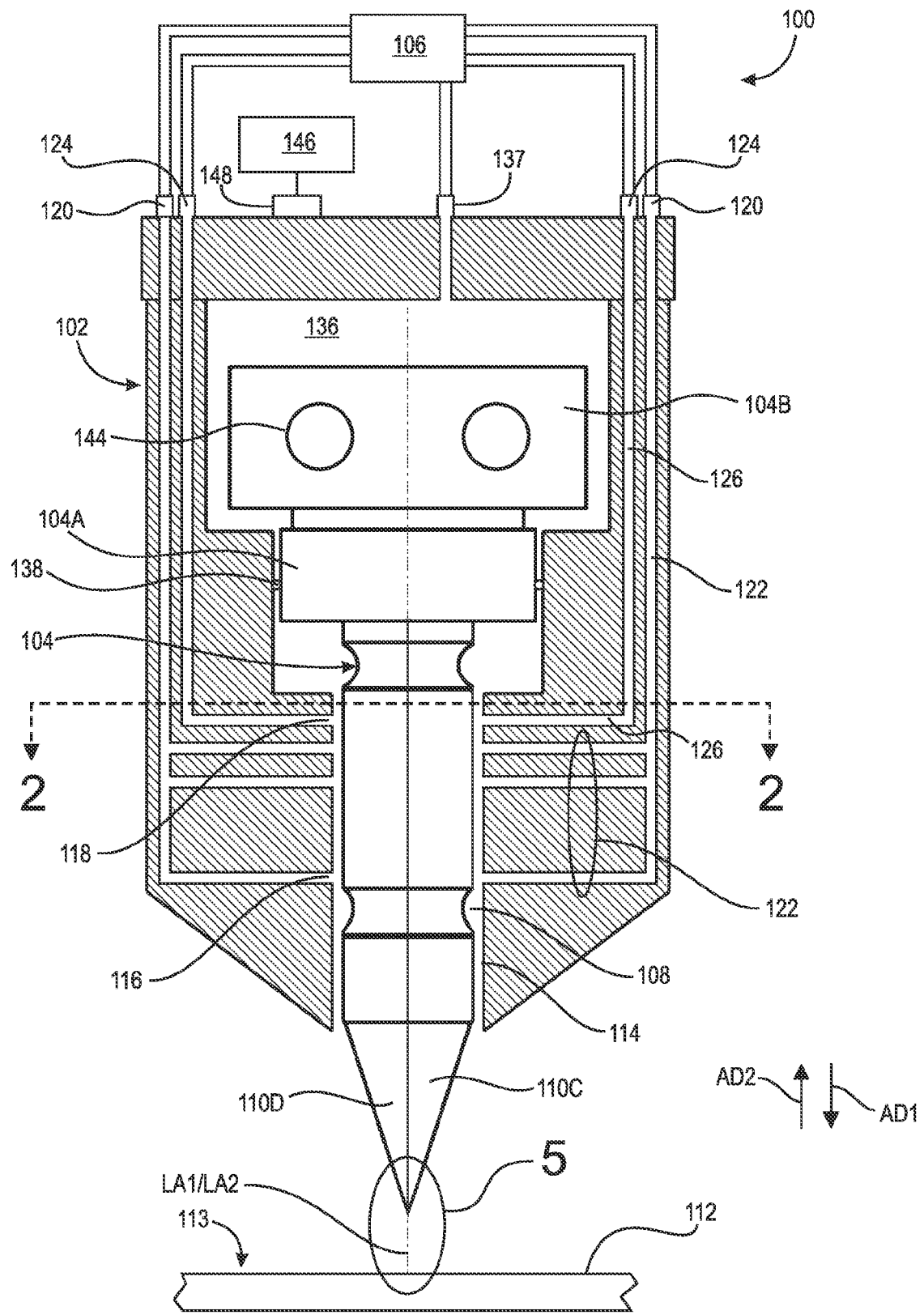
FIG. 1 is a schematic view of a variable pressure probe pin device.

FIG. 1 is a schematic cross-sectional view of variable pressure probe pin device 100.

Figure 2:
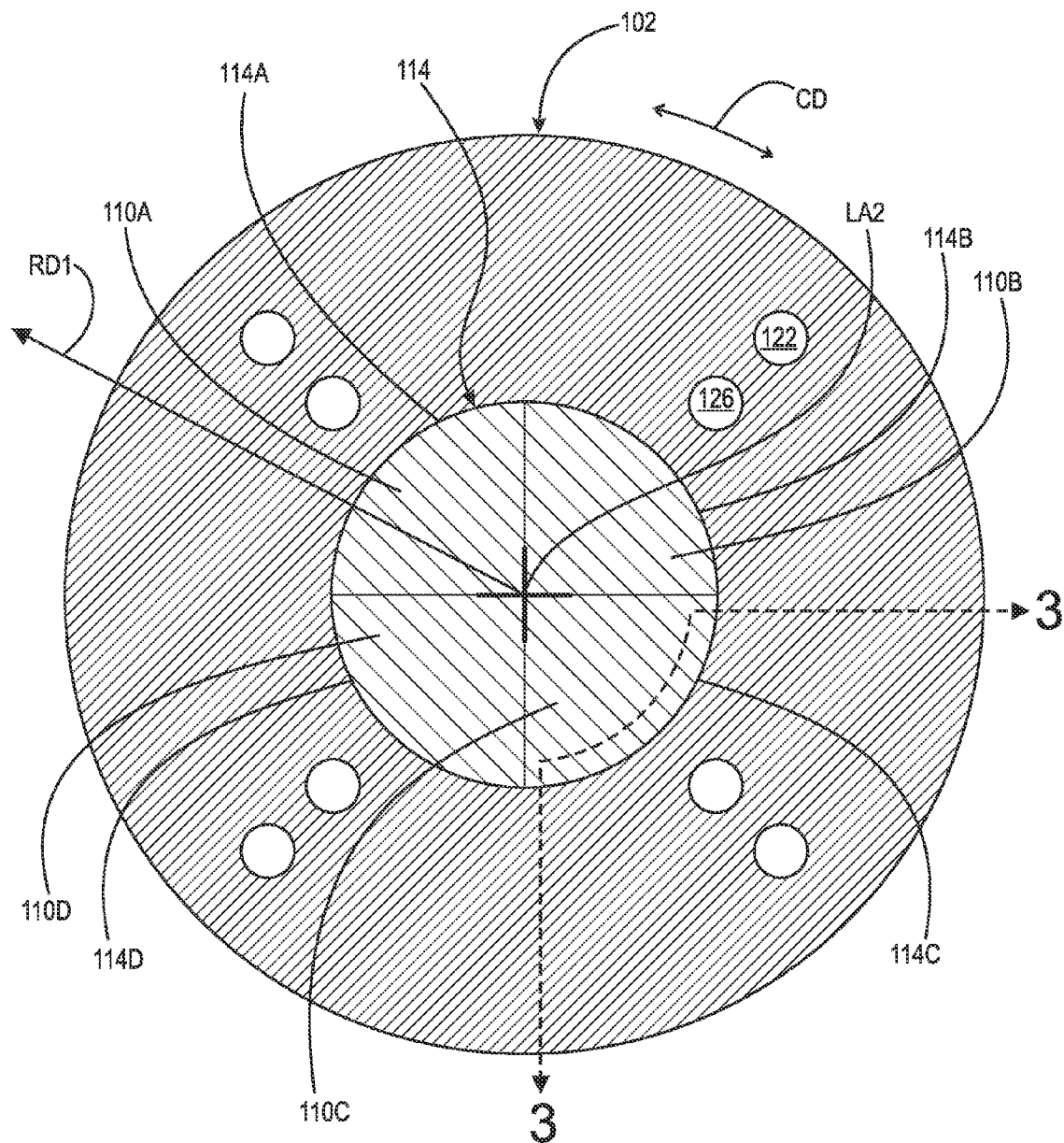
FIG. 2 is a schematic cross-sectional view generally along line 2-2 in FIG. 1.

FIG. 2 is a schematic cross-sectional view generally along line 2-2 in FIG. 1. The following should be viewed in light of FIGS. 1 and 2. Device 100 includes housing 102, probe 104, and fluid pressure system 106. Housing 102 includes channel 108 with longitudinal axis LA1. Probe 104 is at least partially disposed in channel 108 and includes a plurality of probe pins 110 configured to measure a property of conductive layer 112 on wafer 113. Advantageously, fluid pressure system 106 is configured to supply pressurized fluid o channel 108 to control a position of probe 104 and probe pins 110 within channel 108, for example, orthogonal to axis LA1, as further described below. Housing 102 and/or probe 104 are displaceable, for example in direction AD1, such that the plurality of probe pins 110 contact conductive layer 112. In an example embodiment, AD1 is parallel to LA1 and orthogonal to layer 112.

Conductive layer 112 can include: an implanted region of a semiconductor substrate such as an ultra shallow junction; a layer formed on a semiconductor substrate such as a metallization layer; or a feature formed on a semiconductor substrate such as a gate electrode. Conductive layer 112 can also be formed on a semiconductor substrate having a diameter of greater than approximately 200 mm. Conductive layer 112 can also include a metal film formed on a glass substrate having a diameter of approximately 200 mm to approximately 300 mm. However, it should be understood that conductive layer 112 can include any appropriate conductive layer known in the art.

Figure 3:
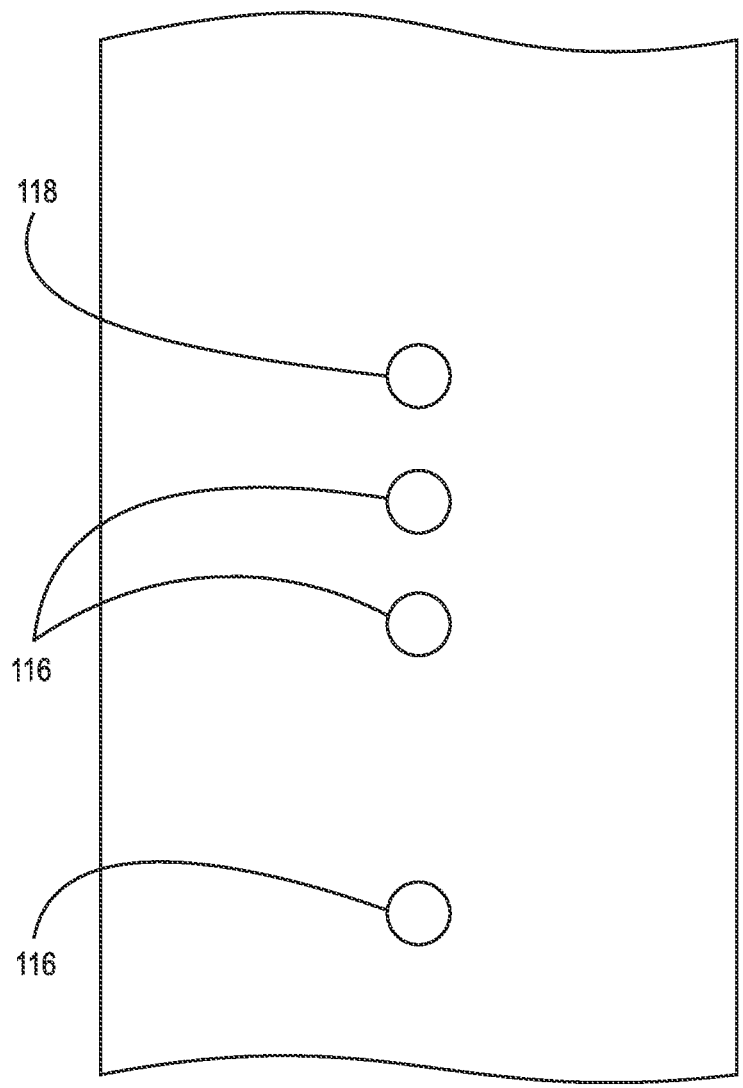
FIG. 3 is a schematic cross-sectional view generally along line 3-3 in FIG. 2.

FIG. 3 is a schematic cross-sectional view generally along line 3-3 in FIG. 2. The following should be viewed in light of FIGS. 1 through 3. In an example embodiment, housing 102 includes cylindrical wall 114 forming channel 108, and wall 114 includes a plurality of openings 116 and a plurality of openings 118. Fluid pressure system 106 is configured to supply the pressurized fluid through openings 116 and exhaust the pressurized fluid through openings 118. As further described below, the pressurized fluid is arranged to separate probe 104 from cylindrical wall 114 by forming a layer between probe 104 and wall 114. That is, the pressurized fluid orients probe 104 with respect to axis LA1, for example, aligning longitudinal axis LA2 for probe 104 with axis LA1 to enable an orthogonal orientation of axis LA2 with respect to layer 112. Stated otherwise, the pressurized fluid controls a position of probe 104, within channel 108, orthogonal to axis LA1. Further, the pressurized fluid centers probe 104 in channel 108 and provides a fluid cushion/bearing to facilitate displacement of probe 104 in directions AD1 and AD2 (opposite AD1) and reduce frictional force on the outer circumference of probe 104.

In an example embodiment, probe pins 110 include probe pins 110A, 110B, 110C, and 110D, symmetrically disposed about axis LA2 in a circumferential direction, for example, direction CD. By "circumferential direction" we mean a direction defined by an end of a radius rotated about axis LA2. Cylindrical wall 114 includes portions 114A, 114B, 114C, and 114D. Each portion 114A, 114B, 114C, and 114D is aligned, in radial direction RD1 with a respective one of probe pins 110A, 110B, 110C, or 110D. For example, portion 114A is aligned in direction RD1 with pin 110A and portion 114B is aligned in direction RD1 with pin 110B. By "radial direction RD1" we mean a direction orthogonal to axis LA2. In an example embodiment, each portion 114A, 114B, 114C, and 114D includes a same number of respective openings 116 and a same number of respective openings 118. Thus, fluid flow into and out of channel 108, and fluid pressure within channel 108 is balanced about the outer circumference of probe 104.

In an example embodiment, housing 102 includes at least one input port 120 for receiving pressurized fluid from fluid supply system 106 and plurality of channels 122 connecting input port(s) 120 to openings 116. That is, pressurized fluid is supplied to channel 108 via port(s) 120 and channels 122. In an example embodiment, housing 102 includes at least one output port 124 for exhausting pressurized fluid from housing 102, and a plurality of channels 126 connecting port(s) 124 to openings 118.

Figure 4:
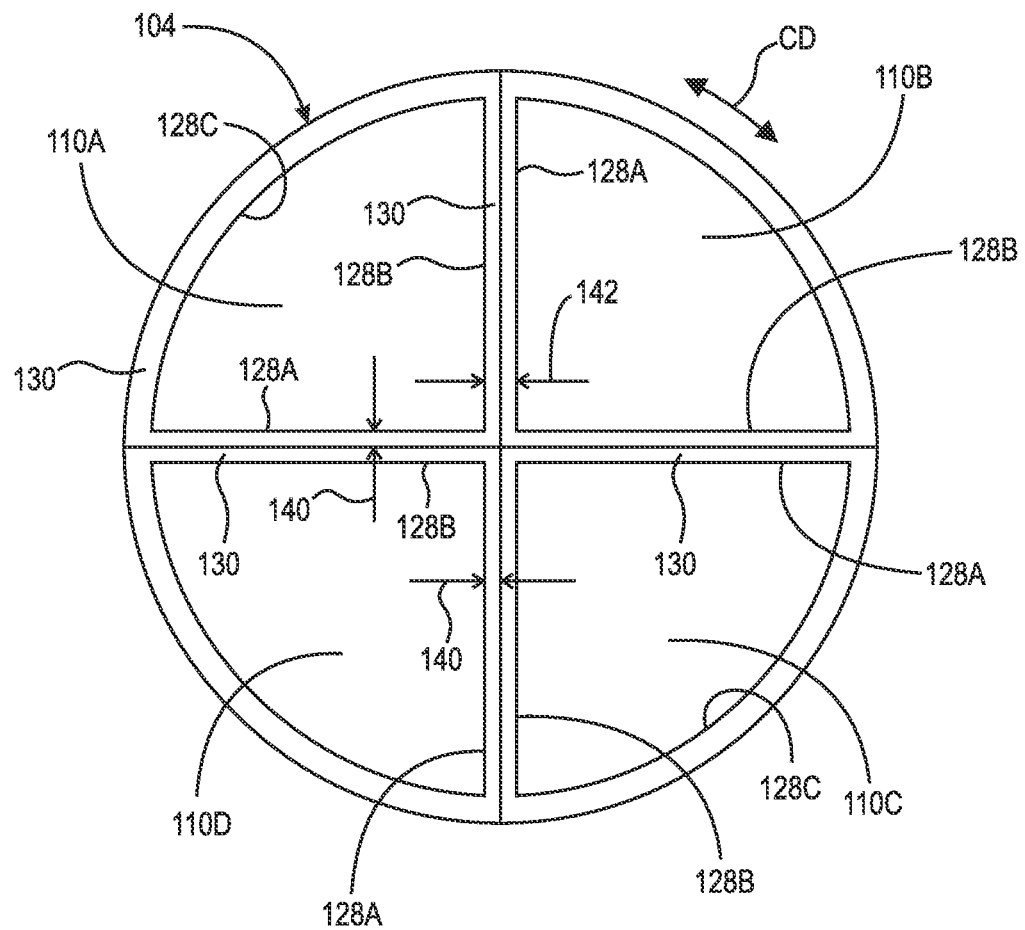
FIG. 4 is a detail of the probe pins shown in FIG. 2.

FIG. 4 is a detail of the probe pins shown in FIG. 2.

Figure 5:
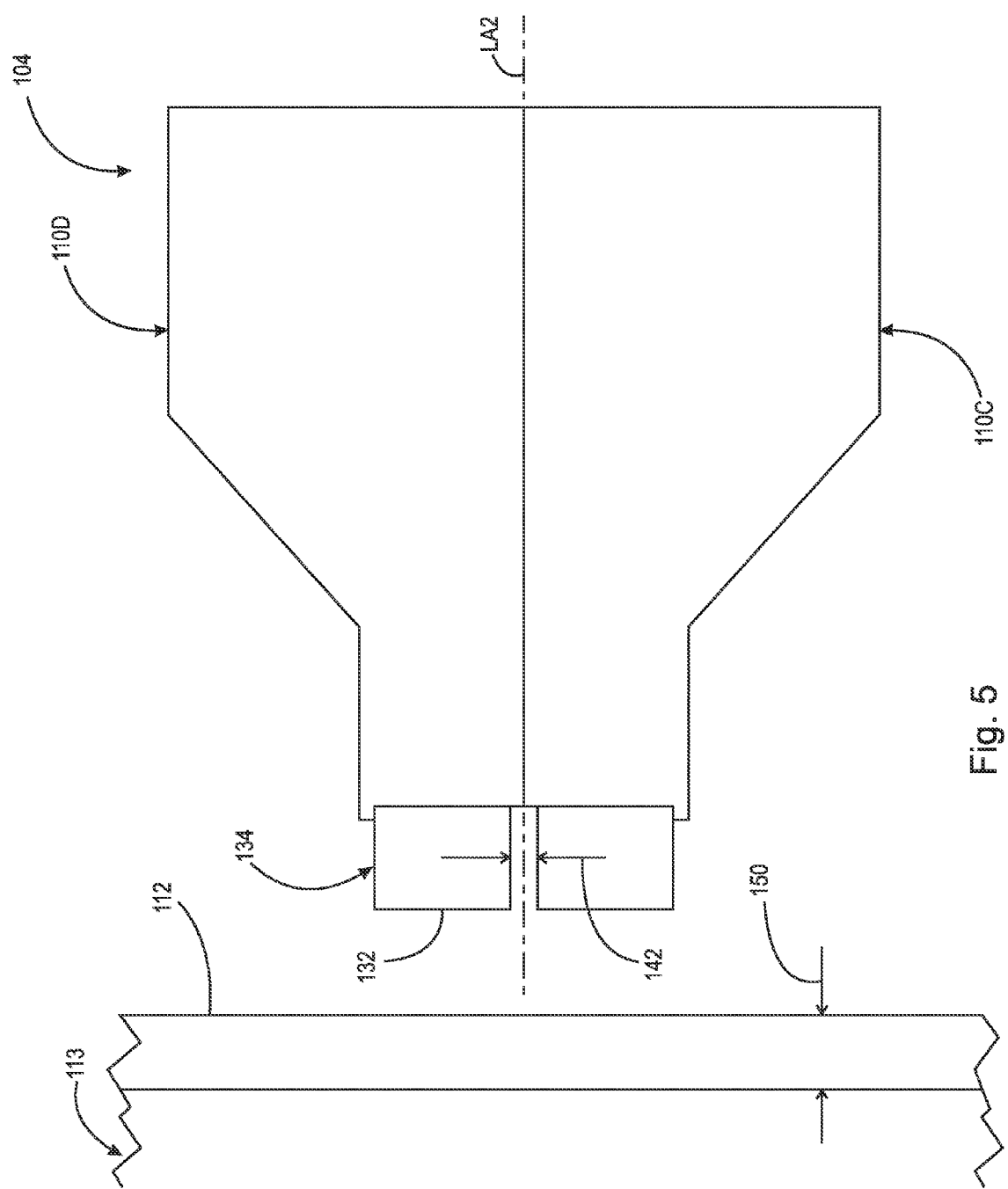
FIG. 5 is a detail of area 5 in FIG. 1.

FIG. 5 is a detail of area 5 in FIG. 1.

Figure 6:
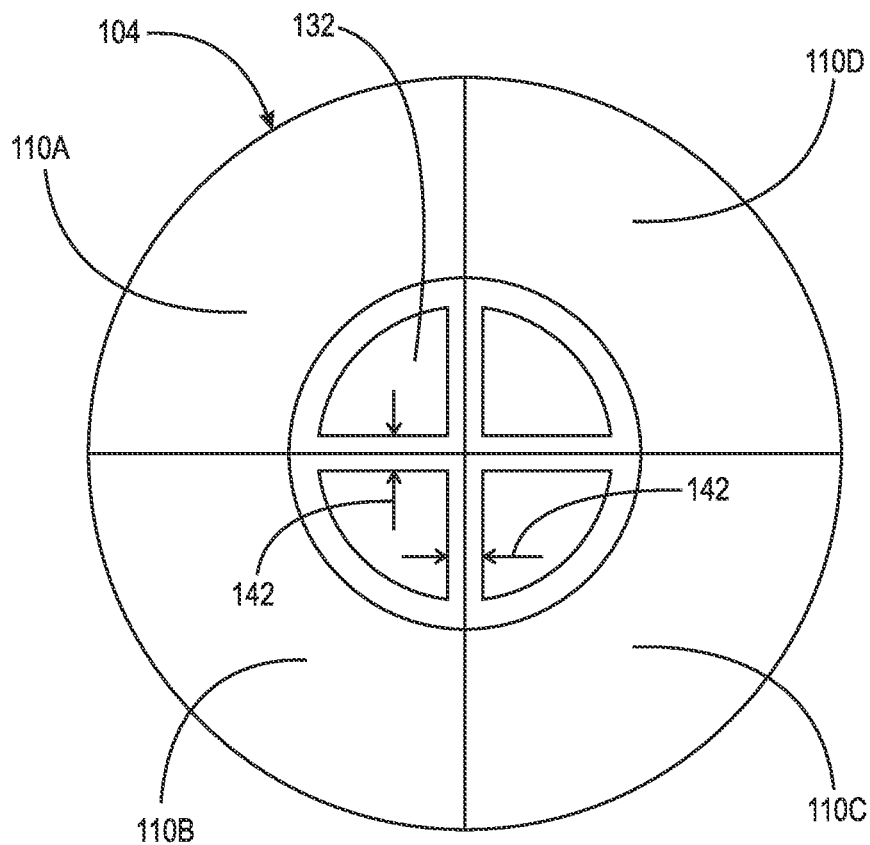
FIG. 6 is an end view of area 5 in FIG. 1.

FIG. 6 is an end view of area 5 in FIG. 1. The following should be viewed in light of FIGS. 1 through 6. Each of probe pins 110A, 110B, 110C, and 110D includes respective surfaces 128A and 128B facing respective adjoining probe pins 110A, 110B, 110C, and 110D. For example, pin 110D includes surfaces 128A and 128B facing surfaces 128B and 128A for probe pins 110C and 110A, respectively, and pin 110B includes surfaces 128A and 128B facing surfaces 128B and 128A for probe pins 110A and 110C, respectively. Respective surfaces 128A and 128B are covered with electrically insulating coating 130 and are in contact with the respective adjoining probe pins/coatings. For example, coating 130 for surfaces 128A and 128B of pin 110C are in contact with coating 130 for surfaces 128B and 128A of probe pins 110B and 110D, respectively. In an example embodiment, each of probe pins 110A, 110B, 110C, and 110 is independently displaceable, parallel to axis LA2, with respect to the remaining probe pins 110A, 110B, 110C, and 110D. That is, each probe pin 110A, 110B, 110C, and 110D "floats" within channel 108. In an example embodiment, coating 130 extends to respective outer circumferential surfaces 128C of the pins. Note that the figures are not to scale and that the thickness of coating 130 may be exaggerated for purposes of illustration.

In an example embodiment, each probe pin 110 includes a respective planar distal surface 132 on distal portion 134 of the pin 110 arranged to contact conductive layer 112. Distal planar surfaces for a probe pin device are further described in commonly owned U.S. Pat. No. 6,815,959, which patent is incorporated in its entirety herein.

In an example embodiment, housing 102 includes pressure chamber 136 and fluid pressure system 106 is configured to control fluid pressure in chamber 136, via port 137, to displace probe 104 in direction AD1 to contact layer 112. For example, increasing fluid pressure in chamber 136 urges probe 104 in direction AD1. As fluid pressure in chamber 136 decreases, pressure from the fluid in channel 108 on portion 104A of probe 104 urges probe 104 in direction AD2 against the fluid pressure force from chamber 134.

Figure 7:
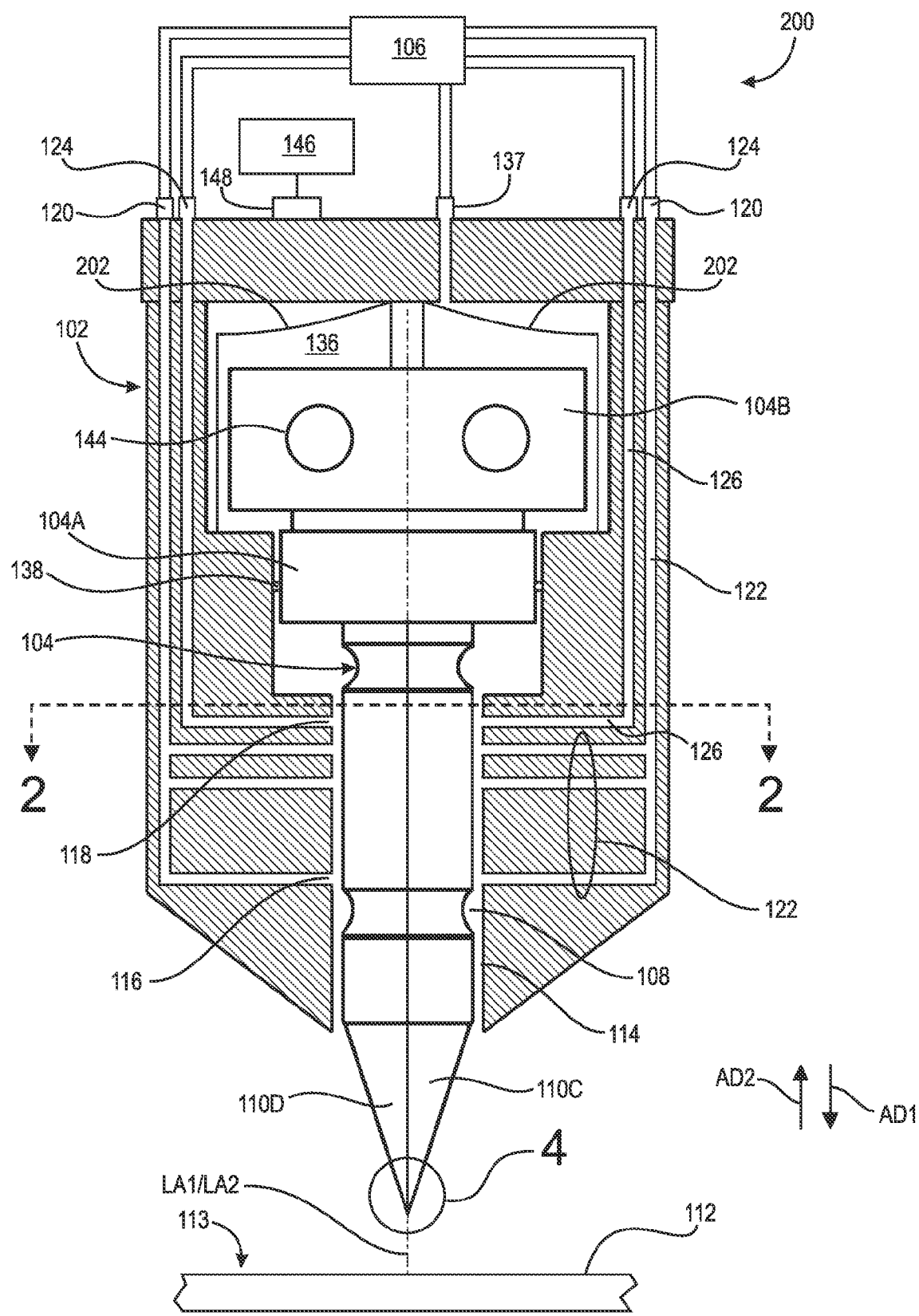
FIG. 7 is a schematic cross-sectional view of a variable pressure probe pin device.

FIG. 7 is a schematic cross-sectional view of variable pressure probe pin device 200. The discussion regarding device 100 is applicable to device 200 except as noted. In an example embodiment, device 200 includes resilient element 202 engaged with housing 102 and probe 104 to urge probe 104 in direction AD1 to contact layer 112. Element 202 can be any resilient element known in the art, for example a leaf spring. As noted above, fluid pressure/flow in channel 108 centers probe 104 and aligns probe 104 with axis LA1. This centering and aligning force counteracts possible skewing of probe 104 by resilient element 202 so that, for example, a desired orthogonal orientation of LA2 with respect to conductive layer 112 is attained and maintained.

In an example embodiment, resilient element 202 is located in chamber 136 to augment pressure applied to probe 104 by fluid in chamber 136 to displace probe 104 in direction AD1.

The following provides further detail regarding devices 100 and 200. The discussion that follows is directed primarily to device 100; however, it should be understood that the discussion is generally applicable to device 200 as well. Any fluid known in the art, including, but not limited to perfluoroether, can be used in fluid pressure system 106. In an example embodiment, any gas known in the art is used in fluid pressure system 106. The gas includes, but is not limited to air, inert gases such as nitrogen and argon, mixtures of inert gases, and mixtures inert gases with other gases. In an example embodiment, coating 130 is a diamond coating or $Si_3N_4$ to provide electrical isolation and abrasion resistance and minimize friction between coating 130 on adjoining pins 110. In an example embodiment, seal device 138, for example an O-ring, seals channel 108 with respect to the probe, in particular, portion 104A, and also provides a seal between channel 108 and chamber 136. Device 138 can be made of any material known in the art.

As noted above, probe pins 110A, 110B, 110C, and 110D are displaceable with respect to each other. Thus, advantageously, the probe pins can be separately and independently installed and removed from probe 104. For example, if one pin is damaged, the pin can be replaced while leaving the remaining pins in place. In like manner, pins can be easily changed out according to the required parameters for a particular application. Fluid pressure in channel 108 urges probe pins 110A, 110B, 110C, and 110D toward axis LA2, that is, toward each other, maintaining the desired contact and configuration of probe pins 110A, 110B, 110C, and 110D.

Unlike the spacers noted above made of separate sheets of insulating material disposed between the pins, coating 130, with thickness 140, does not need to be self-supporting. Therefore, gap, or spacing, 142 between adjoining pins 110 can be advantageously minimized to provide a desired electrical isolation and friction reduction without requiring additional bulk for structural purposes. Thus, due to the configuration of surfaces 128A and 128B (parallel to axis LA2 and orthogonal to respective planar distal surfaces 132), the relative thinness of coating 130, and radially inward pressure of fluid in channel 108 urging probe pins 110A, 110B, 110C, and 110D toward axis LA2, gap 142 is advantageously reduced to a minimum. For example, gap 142 is substantially equal to the respective thicknesses 140 of coating 130 for adjoining pins 110. In an example embodiment, gap 142 is 10 microns. Further, fluid pressure in channel 108 reduces variations in spacing of pins 110 by forcing respective coatings 130 for opposing surfaces 128A and 128B into contact.

Because surfaces 132 are planar, the area of the surfaces can be minimized without weakening distal ends 134. In an example embodiment, an area of surface 132 is one square micron.

By controlling fluid pressure in chamber 136, simple, predictable, and repeatable control of force on probe 104 in direction AD1, for example, to provide the desired degree of penetration into layer 112 for purposes of measuring a characteristic of the layer, is enabled. Thus, the force in direction AD1 can be adapted to the particular physical characteristics of layer 112, such as hardness or thickness, and the parameters of the desired measurement operation, such as extent of penetration into layer 112.

In an example embodiment, probe 104 includes portion 104B with electrical connection points 144. Points 144 can be any type of points known in the art, including, but not limited to solder points. Points 144 are electrically connected to measurement system 146, via interface 148, as is known in the art. Note that details such as wiring have been omitted in the interest of clarity.

In an example embodiment, device 100 and system 146 are used to measure sheet resistance and/or thickness of layer 112. In an example embodiment, device 100 and system 146 are used to measure resistivity of layer 112, which is a bulk property. Resistivity is applicable to layer 112 when thickness 150 of the layer is significantly greater than pin spacing 142, for example, when the thickness is about 5 times or more spacing 142. Advantageously, the minimization of spacing 142 for probe 104 enables measurement of resistivity for thinner layers than is possible with known probes, expanding the utility of device 100.

Figure 8:
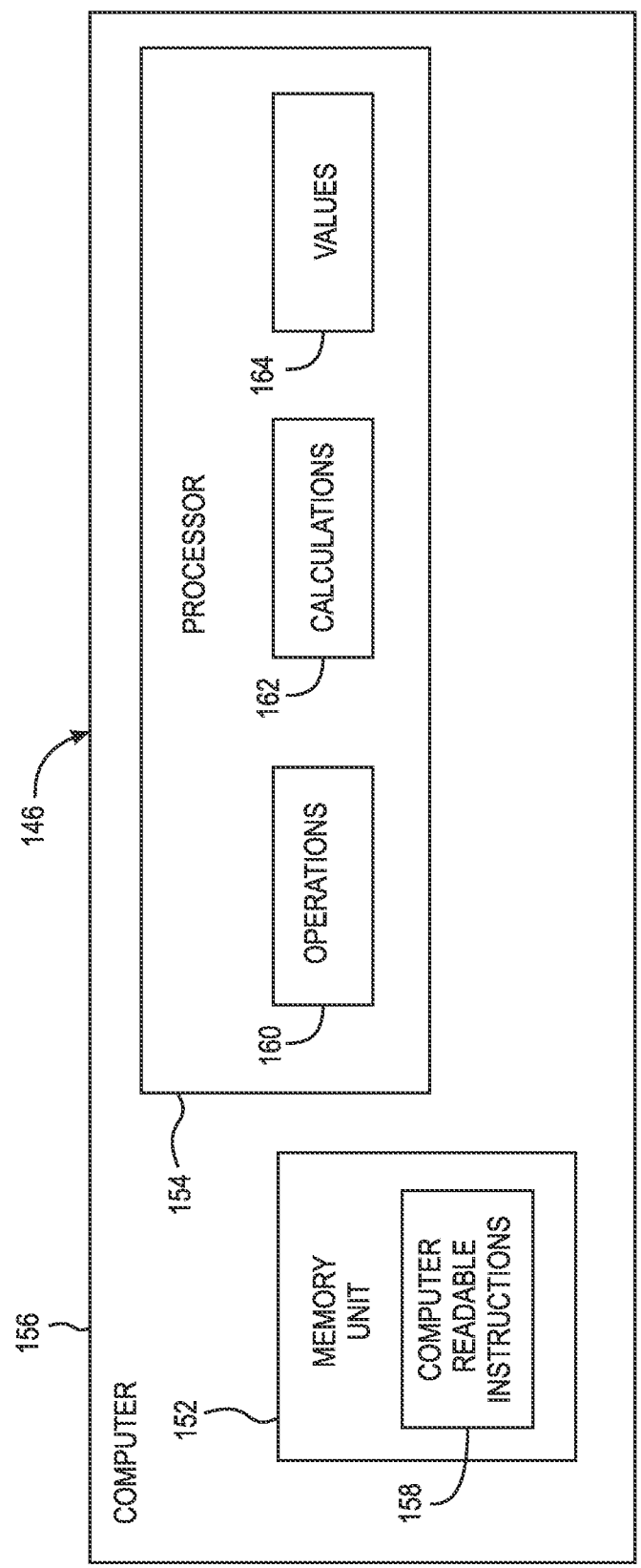
FIG. 8 is a schematic block diagram of the control system shown in FIGS. 1 and 7.

FIG. 8 is a schematic block diagram of control system 146 shown in FIGS. 1 and 7. In an example embodiment, system 146 includes memory unit 152 and processor 154 for at least one computer 156. Unit 152 is configured to store computer readable instructions 158. The processor is configured to execute the computer readable instructions to control the pressurized fluid for channel 108, the fluid pressure in chamber 136, and displacement of housing 102 as needed. The processor is configured to execute the computer readable instructions to perform operations 160 required to perform measuring operations using probe 104, for example, applying specified current via specified pins 110, and to perform calculations 162 to determine measurement values 164, for example, values for sheet resistance, thickness, and/or resistivity of layer 112. Memory unit 152, processor 154, and the at least one computer 156 can be any memory unit, processor, or computer known in the art.

Figure 9:
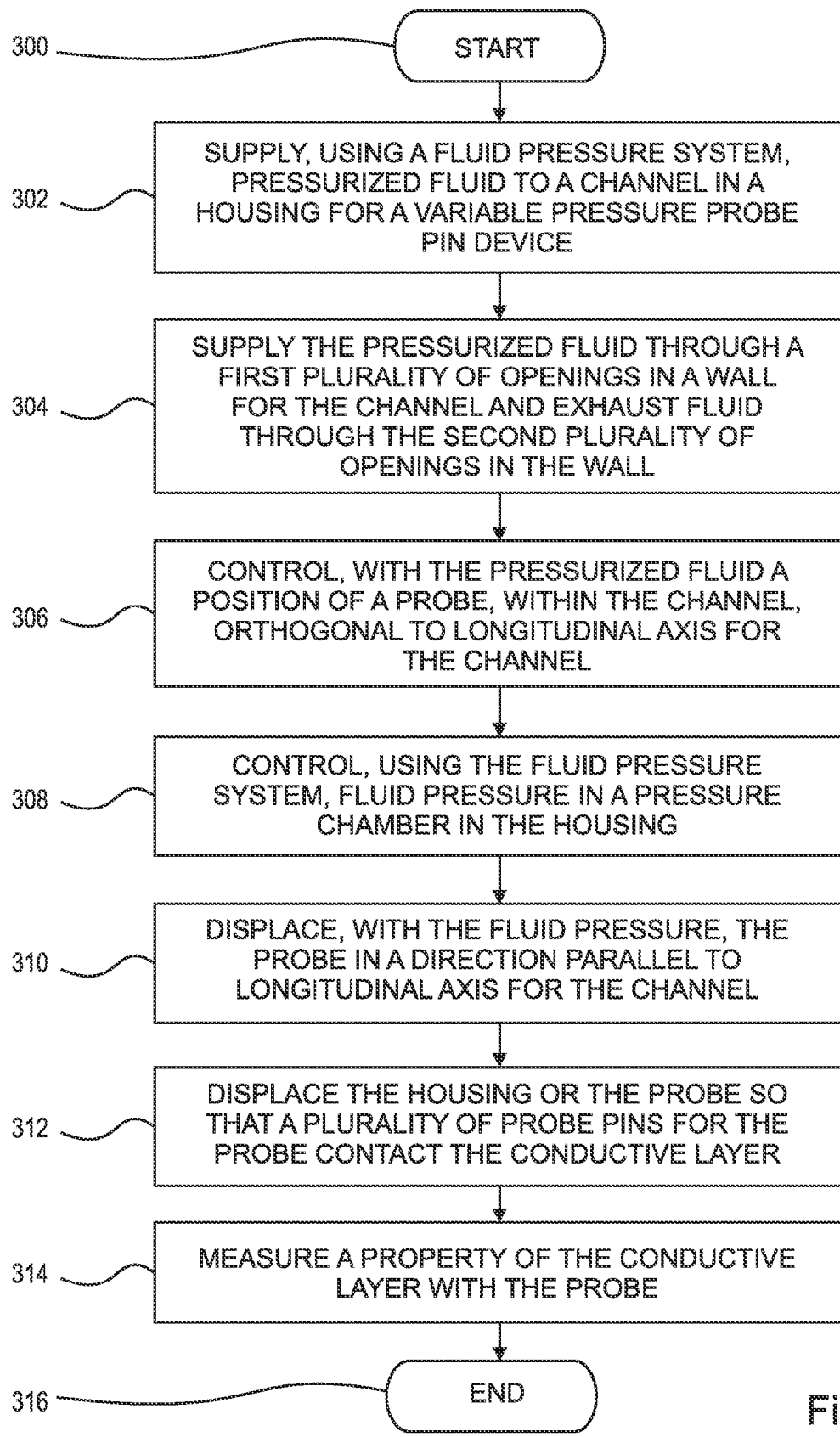
FIG. 9 is a flow chart illustrating a method of measuring a property of a conductive layer using a variable pressure probe pin device; and, FIG. 10 is an isometric view of a system having at least two variable pressure probe pin devices in a mounting device.

FIG. 9 is a flow chart illustrating a method of measuring a property of a conductive layer using a variable pressure probe pin device, such as device 100 or 200, including: a housing, such as housing 102, with a channel, such as channel 108, having a first longitudinal axis, such as axis LA1, a fluid pressure system, such as system 106, and a probe, such as probe 104, at least partially disposed in the channel, and with a plurality of probe pins, such as pins 110, configured to measure the property of the conductive layer, such as layer 112. Although the method in FIG. 8 is depicted as a sequence of numbered steps for clarity, no order should be inferred from the numbering unless explicitly stated.

The method starts at step 300. Step 302 supplies, using the fluid pressure system, pressurized fluid to the channel. Step 306 controls, with the pressurized fluid, a position of the probe, within the channel, orthogonal to the first longitudinal axis. Step 312 displaces the housing or the probe so that the plurality of probe pins contact the conductive layer. Step 314 measures a property of the conductive layer with the probe. The method ends with step 316.

In an example embodiment, the housing includes a pressure chamber, such as chamber 136. Step 308 controls, using the fluid pressure system, fluid pressure in the pressure chamber. Step 310 displaces, with the fluid pressure, the probe in a direction, such as direction AD1, parallel to the first longitudinal axis.

In an example embodiment: the housing includes a cylindrical wall, such as wall 114, forming the channel; the cylindrical wall includes first and second pluralities of openings, such as openings 116 and 118, respectively; the probe includes a second longitudinal axis, such as axis LA2; the plurality of probe pins includes first, second, third, and fourth probe pins, such as probe pins 110A, 110B, 110C, and 110D, symmetrically disposed about the second longitudinal axis; and the cylindrical wall includes four portions, each portion aligned, in a direction orthogonal to the first longitudinal axis, with a respective probe pin from among the first, second, third, and fourth probe pins. Step 304 supplies the pressurized fluid through the first plurality of openings and exhausts fluid through the second plurality of openings. In an example embodiment, said each portion includes a same number of respective openings from the first plurality of openings, and a same number of respective openings from the second plurality of openings.

In an example embodiment: the probe includes a second longitudinal axis, such as axis LA2; the plurality of probe pins includes first, second, third, and fourth probe pins, such as probe pins 110A, 110B, 110C, and 110D, symmetrically disposed about the second longitudinal axis; each of the first, second, third, and fourth probe pins includes respective first and second surfaces, such as surfaces 128A and 128B, facing respective adjoining probe pins from among the first, second, third, and fourth probe pins; for said each of the first, second, third, and fourth probe pins the respective first and second surfaces are covered by a coating of an electrically insulating material, such as coating 130. In an example embodiment, step 306 includes urging the probe pins, such as pins 110A, 110B, 110C, and 110D, into contact with each other such that each of the first, second, third, and fourth probe pins is non-fixedly engaged with the respective adjoining probe pins.

Figure 10:
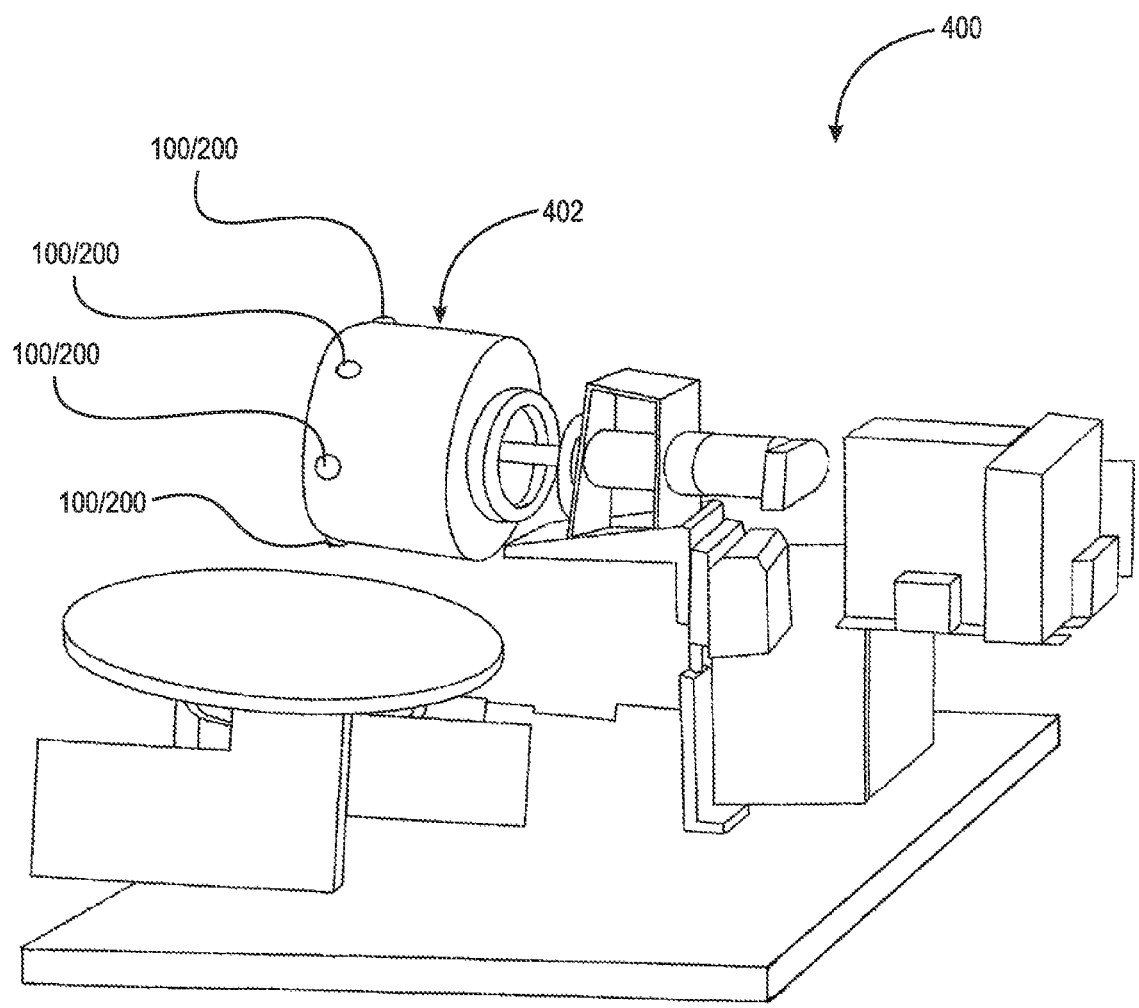

FIG. 10 is an isometric view of system 400 having at least two variable pressure probe pin devices 100 or 200 in mounting device 402. It should be understood that only devices 100, only devices 200, or a combination of devices 100 and 200 can be mounted in device 402. Mounting device 402 is configured to rotate such that the distal surfaces of one of devices 100 or 200 in device 402 is positioned above an upper surface of a conductive layer such as layer 112. Further detail regarding system 400 is provided in commonly-owned U.S. Pat. No. 6,815,959, which patent is incorporated in its entirety herein.

Any fluid known in the art can be used for the fluid, including, but not limited to perfluoroether. In an example embodiment, any gas known in the art is used for the fluid.

It will be appreciated that various of the above-disclosed and other features and functions, or alternatives thereof, may be desirably combined into many other different systems or applications. Various presently unforeseen or unanticipated alternatives, modifications, variations, or improvements therein may be subsequently made by those skilled in the art which are also intended to be encompassed by the following claims.

What is claimed is:

1. A variable pressure probe pin device, comprising:
a housing including a channel with a first longitudinal axis;
a probe at least partially disposed in the channel and including a plurality of probe pins configured to measure a property of a conductive layer; and,
a fluid pressure system configured to supply pressurized fluid to the channel to control a position of the probe within the channel, wherein:
the housing or the probe is displaceable such that the plurality of probe pins contact the conductive layer.

2. The device of claim 1, wherein:
the fluid pressure system configured to supply the pressurized fluid to the channel to control a position of the probe, within the channel, orthogonal to the first longitudinal axis.

3. The device of claim 1, wherein:
the probe includes a second longitudinal axis;
the plurality of probe pins includes first, second, third, and fourth probe pins symmetrically disposed about the second longitudinal axis in a circumferential direction;
each of the first, second, third, and fourth probe pins includes respective first and second surfaces facing respective adjoining probe pins from among the first, second, third, and fourth probe pins;

for said each of the first, second, third, and fourth probe pins, the respective first and second surfaces are coated with an electrically insulating material and are in contact with the electrically insulating material for the respective adjoining probe pins; and,
said each of the first, second, third, and fourth probe pins is independently displaceable, parallel to the second longitudinal axis, with respect to the remaining first, second, third, and fourth probe pins.

4. The device of claim 1, wherein:
the housing includes a cylindrical wall forming the channel; and,
the pressurized fluid is arranged to separate the probe from the cylindrical wall.

5. The device of claim 1, wherein:
the plurality of probe pins includes four probe pins; and,
each probe pin includes a respective planar distal surface arranged to contact the conductive layer.

6. The device of claim 1, wherein:
the housing includes a pressure chamber; and,
the fluid pressure system is configured to control fluid pressure in the pressure chamber to displace the probe in a direction parallel to the first longitudinal axis.

7. The device of claim 1, further comprising:
a resilient device engaged with the probe and urging the probe in a first direction from the spring toward the channel.

8. The device of claim 1, wherein:
the fluid includes a gas.

9. The device of claim 1, wherein:
the housing includes a cylindrical wall forming the channel and including first and second pluralities of openings; and,
the fluid pressure system is configured to:
supply the pressurized fluid through the first plurality of openings; and,
exhaust the pressurized fluid through the second plurality of openings.

10. The device of claim 9, wherein:
the probe includes a second longitudinal axis;
the plurality of probe pins includes first, second, third, and fourth probe pins symmetrically disposed about the second longitudinal axis in a circumferential direction;
the cylindrical wall includes four portions, each portion aligned, in a direction orthogonal to the first longitudinal axis, with a respective one of the first, second, third, or fourth probe pins; and,
said each portion includes:
a same number of respective openings from the first plurality of openings; and,
a same number of respective openings from the second plurality of openings.

11. The device of claim 9, wherein:
the housing includes:
at least one input port for receiving the pressurized fluid from the fluid pressure system and a first plurality of channels connecting the at least one input port to the first plurality of openings; and,
at least one output port for exhausting the pressurized fluid from the housing and a second plurality of channels connecting the at least one output port to the second plurality of openings.

12. A variable pressure probe pin device, comprising:
a housing including a pressure chamber and a channel with a first longitudinal axis;

a probe at least partially disposed in the channel and including a plurality of probe pins configured to measure a property of a conductive layer; and, a fluid pressure system configured to control fluid pressure in the pressure chamber to displace the probe in a direction parallel to the first longitudinal axis.

13. The device of claim 12, wherein:

the fluid pressure system is configured to supply pressurized fluid to the channel to control a position of the probe, within the channel, orthogonal to the first longitudinal axis.

14. The device of claim 12, wherein:

the probe includes a second longitudinal axis;

the plurality of probe pins includes first, second, third, and fourth probe pins symmetrically disposed about the second longitudinal axis;

each of the first, second, third, and fourth probe pins includes:
- a respective first surface, coated with an electrically insulating material, in contact with a respective adjoining probe pin from one of the first, second, third, or fourth probe pins; and,
- a respective second surface, coated with the electrically insulating material, in contact with a respective adjoining probe pin from another of the first, second, third, or fourth probe pins; and, the pressurized fluid is arranged to urge the first, second, third, and fourth probe pins into contact with each other.

15. The device of claim 12, further comprising:

a resilient device engaged with the probe and urging the probe in a direction from the spring toward the channel.

16. The device of claim 12, wherein:

the fluid includes a gas.

17. A method of measuring a property of a conductive layer using a variable pressure probe pin device including a housing with a channel having a first longitudinal axis, a fluid pressure system, and a probe at least partially disposed in the channel and with a plurality of probe pins, comprising:

supplying, using the fluid pressure system, pressurized fluid to the channel;

controlling, with the pressurized fluid, a position of the probe within the channel;

displacing the housing or the probe so that the plurality of probe pins contact the conductive layer; and, measuring, with the probe, a property of the conductive layer.

18. The method of claim 17 wherein:

the housing includes a pressure chamber, the method further comprising:

controlling, using the fluid, fluid in the pressure chamber; and, displacing, with the fluid pressure, the probe in a direction parallel to the first longitudinal axis.

19. The method of claim 17 wherein:

the probe includes a second longitudinal axis;

the plurality of probe pins includes first, second, third, and fourth probe pins symmetrically disposed about the second longitudinal axis;

each of the first, second, third, and fourth probe pins includes respective first and second surfaces facing respective adjoining probe pins from among the first, second, third, and fourth probe pins; and, for said each of the first, second, third, and fourth probe pins the respective first and second surfaces are coated with an electrically insulating material, the method further comprising:

urging, with the pressurized fluid, the first, second, third, and fourth probe pins into contact with each other.

\* \* \* \* \*